US006865525B1

(12) United States Patent
Zhong

(10) Patent No.: US 6,865,525 B1
(45) Date of Patent: Mar. 8, 2005

(54) CIRCUIT SIMULATION USING ENCODING OF REPETITIVE SUBCIRCUITS

(75) Inventor: John Xiaoxiong Zhong, Fremont, CA (US)

(73) Assignee: Synopsys, Inc., Mountain View, CA (US)

(*) Notice: Subject to any disclaimer, the term of this patent is extended or adjusted under 35 U.S.C. 154(b) by 783 days.

(21) Appl. No.: 09/774,989

(22) Filed: Jan. 30, 2001

Related U.S. Application Data

(60) Provisional application No. 60/252,807, filed on Nov. 22, 2000.

(51) Int. Cl.[7] ............................................. G06F 17/50
(52) U.S. Cl. ....................................................... 703/14
(58) Field of Search ............................. 703/14, 28, 17, 703/21, 11; 364/489; 716/4; 330/2, 51, 149; 430/5, 30

(56) References Cited

U.S. PATENT DOCUMENTS

| | | | | |
|---|---|---|---|---|
| 5,546,562 A | * | 8/1996 | Patel ............................ | 703/14 |
| 5,910,897 A | * | 6/1999 | Dangelo et al. ............. | 364/488 |
| 5,991,533 A | * | 11/1999 | Sano et al. ................... | 703/28 |
| 6,041,170 A | | 3/2000 | Feldmann et al. | |
| 6,134,513 A | | 10/2000 | Gopal | |
| 6,577,992 B1 | * | 6/2003 | Tcherniaev et al. ........... | 703/14 |

OTHER PUBLICATIONS

Bogliolo et al., "Reliability evaluation of combinational logic circuits by symbolic simulation", IEEE 1995.*
Cabodi et al., "Improved Reliability analysis of large finite state machines", IEEE 1996.*
Clarke, E.M., et al.: "Computer–aided Verification", IEEE Spectrum, IEEE, Inc., New York, US, vol. 33, No. 6, Jun. 1, 1996, pp. 61–67, XP000596688.

Sangiovanni–Vincentelli, A.L., et al: "Verification of Electronic Systems" 33rd Design Automation Conference., Proceedings 1996 (IEEE Cat. No. 96CH35932), Proceedings of 33rd Design Automation Conference, Las Vegas, NV USA Jun. 3–7, 1996, pp. 106–111, XP002229689.
Burch, J.R., et al.: "Symbolic Model Checking for Sequential Circuit Verification", IEEE Transactions on Computer Aided Sign of Integrated Circuits and Systems, IEEE Inc., New York, US, vol. 13, No. 4, Apr. 1, 1994, pp. 401–424, XP000453301.
Chakrabarti, D.R., et al.: "An Improved Hierarchical Test Generation Technique for Combinational Circuits with Repetitive Sub–circuits", Test Symposium, 1995, Proceedings of the Fourth Asian Bangalore, India Nov. 23–24, 1995, Los Alamitos, CA, USA, IEEE Comput. Soc., US, Nov. 23, 1995, pp. 237–243, XP010155535.
Akhuputra, V., et al.: "A Speaker–Independent Thai Polysyllabic Word Recognition Using Hidden Markov Model", Communications, Computers and Signal Processing, 1997. 10 Years pacrim 1987–1997—Networking the Pacific Rim. 1997 IEEE Pacific Rim Conference on Victoria, BC, Canada Aug. 20–22, 1997, New York, NY, USA, IEEE, US, pp. 593–599, XP010245046.

* cited by examiner

Primary Examiner—Kevin J. Teska
Assistant Examiner—Kandasamy Thangavelu
(74) Attorney, Agent, or Firm—Bever, Hoffman & Harms LLP; Jeanette S. Harms

(57) ABSTRACT

A method and apparatus for simulating a circuit is described. In one embodiment, the method comprises representing a plurality of identical components in a reduced form as a circuit having a single instance of the identical component with encoding for each input of the single instance to represent corresponding inputs to all of the plurality of identical components and decoding for each output port of the single instance to create output ports for the outputs associated with all of the plurality of identical components and symbolically simulating the reduced form of the circuit with simulation results being the same as results of symbolically simulating the plurality of identical components.

25 Claims, 3 Drawing Sheets

CIRCUIT SIMULATION USING ENCODING OF REPETITIVE SUBCIRCUITS

This application claims benefit of Provisional Application Ser. No. 60/252,807 filed Nov. 22, 2000.

FIELD OF THE INVENTION

The present invention relates to the field of circuit simulation; more particularly, the present invention relates to performing circuit simulation on circuits with repetitive subcircuits by using an encoded representation of the subcircuits.

BACKGROUND OF THE INVENTION

There are a number of prior art techniques to simulate large circuits with repetitive sub-circuits (e.g., a memory array). To simulate such circuits, the state of every circuit element must be represented. Some of these techniques include hierarchical circuit simulation, symbolic simulation, and symbolic model checking.

In hierarchical circuit simulation, repetitive sub-circuits states are stored in a hierarchical form with each sub-circuit being evaluated n times if there are n instances of the subcircuits. However, there is still an explicit record for the state of every circuit node.

In symbolic simulation, symbolic encoding is used to describe the state of a circuit over many operating conditions. After using symbolic encoding, symbolic evaluation is used so that each circuit element computes the behavior of each element for all of the encoded state cases. Each evaluation only computes the behavior of one instance of a circuit element. There is an explicit record of the state of every circuit node.

In a symbolic model checking, the set of all possible system states is encoded symbolically. Symbolic evaluation is used to determine the effect of each possible state transition for each of these possible states. Even so, there is an explicit representation of every circuit state variable.

There are other prior art techniques to handle larger circuits with repetitive sub-circuits for other purposes. For example, Design Rule Checking (DRS) is one of these techniques. In performing DRC on a large circuit, hierarchical information is exploited to take advantage of the repetitive circuit structures to speed up the checking. However, DRC does not require the recording of states of circuit elements dynamically.

SUMMARY OF THE INVENTION

A method and apparatus for simulating a circuit is described. In one embodiment, the method comprises representing a plurality of identical components in a reduced form as a circuit having a single instance of the identical component with encoding for each input of the single instance to represent corresponding inputs to all of the plurality of identical components and decoding for each output port of the single instance to create output ports for the outputs associated with all of the plurality of identical components and symbolically simulating the reduced form of the circuit with simulation results being the same as results of symbolically simulating the plurality of identical components.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

Figure 1:
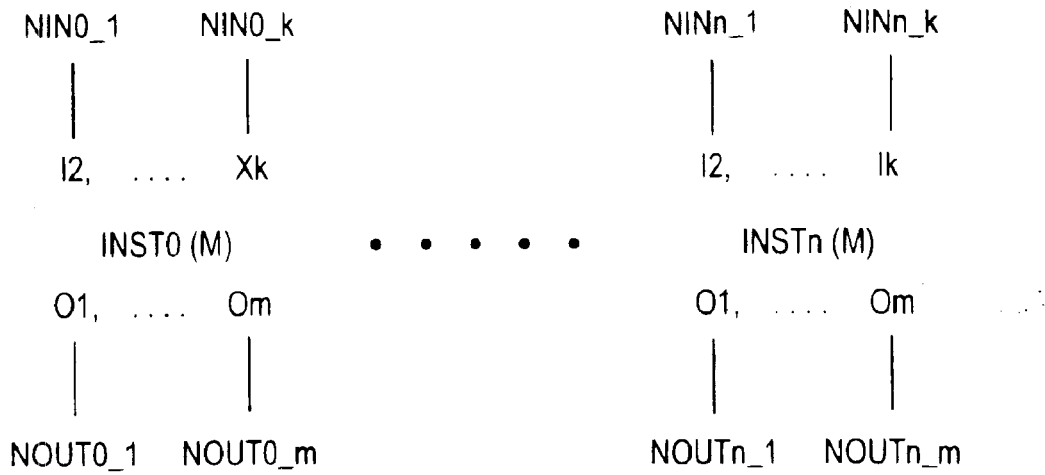
FIG. 1 graphically depicts such a multiple instantiation of submodule M.

The general purpose of the present invention is to be able to perform symbolic or binary simulation on large circuits with repetitive sub-circuits through symbolic encoding of the circuit elements (e.g., nets, ports, etc.) and then utilize symbolic simulation to simulate the reduced, encoded form of the circuit.

Although symbolic encoding has been used to encode the state space of systems (e.g., circuits) for symbolic model checking and equivalence checking, to compensate for the fact that a circuit with n circuit elements can have $2^n$ states, the technique described herein encodes the circuit itself, so that a circuit with n elements could be represented and simulated with data structures that are asymptotically smaller than n ($\log_2(n)$). Using this technique and symbolic simulation achieves a doubly exponential reduction in verification complexity. Furthermore, by combining this technique with symbolic simulation, a doubly exponential reduction in verification complexity is achieved.

In the following description, numerous details are set forth to provide a thorough understanding of the present invention. It will be apparent, however, to one skilled in the art, that the present invention may be practiced without these specific details. In other instances, Well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

The Encoding Algorithm

Assume a sub-circuit or submodule M (in Verilog HDL terminology) with k input ports (I1, . . . , Ik) and m output ports (O1, . . . , Om) is instantiated n+1 times, with each instance being labeled as (INST0, . . . , INSTn). Furthermore, for each input port Ii, it is assumed that nets NINi_) where j=0, . . . , n, are portmapped to port Ii for each instance INSTj. Notice that for each fixed i, there might be $0<=j1<=n$ and $0<=j2<=n$, such that NINi_j1 and NINi_j2 are the same. Similarly, for each output port Oi, it is assumed that nets NOUTi_j, where j=0, . . . , n, are portmapped to port Oi. FIG. 1 graphically depicts such a multiple instantiation of submodule M.

If $l=\log_2(n+1)$ formal variables F1, . . . , Fl and the bit vector (Fl, . . . , F1) value is denoted as F, then intuitively, INSTi may be encoded as F==i. For example, INST1 is encoded as one bit vector (0, 0, . . . , 0, 1). Furthermore, for each input port Ii, a new net referred to herein as PINi is portmapped to Ii. The value of PINi is encoded as part of the encoding process as:

PINi=(NNi_0 && F==0)||(NINi_1 && F==1)|| . . . ||(NINi_n && F==n)

where "&&" represents a logical AND and "||" represents a logical OR.

Similarly, for each output port Oi, a new net referred to herein as POUTi is portmapped to Oi. The value of NOUTi_j is decoded back as part of the output decoding process as:

NOUTi_j=POUTi cofactored by (F=j).

Notice that in the above technique, if there is more than one output port tied to the same net, i.e. say ports NOUTi1_j1, . . . , NOUTiu_ju, where pairs (i1, j1), . . . ,(iu, ju) are different from each other and 'u' is greater than 1, are tied to a net N, an appropriate tristate multi-driver resolution is used to resolve the value of net N from values of its drivers NOUTi1_j1, . . . , NOUTiu_ju. Such a resolution may be dependent on the application and languages. For example, if the above technique is applied to Verilog hardware description language simulation, the multi-driver resolution should obey the semantics defined by Verilog Language Reference Manual.

The above technique could be also applied to a subcircuit which has 'inout' ports. One could first use a standard technique to split an 'inout' port 'P' to an 'input' port 'Pin' and an 'output' port 'Pout', where all of the uses/drivers of 'P' in the subcircuit are replaced by the 'input' port 'Pin' while all of the appearance of 'P' as being driven or left hand side is replaced by the 'output' port 'Pout'.

As a result of the application of the above technique, the n+1 instances of M are compressed into a single instance whose input ports are mapped to encoded nets and whose output values are decoded back to actual nets.

Figure 2:
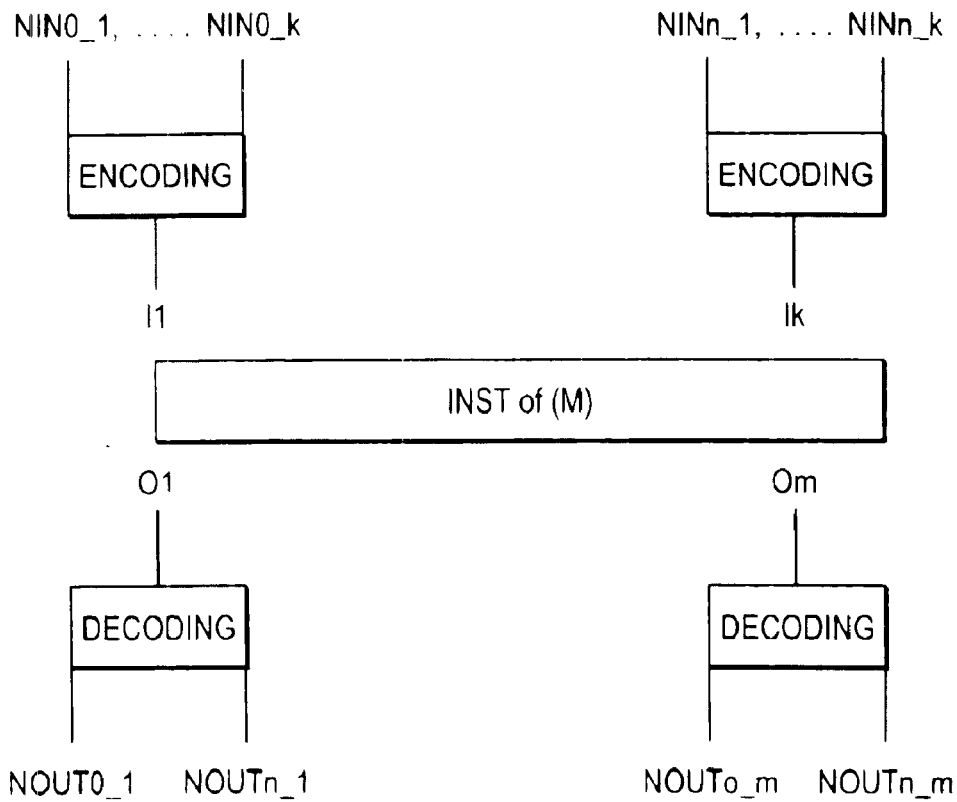
FIG. 2 is a graphical depiction of the application of the above technique.

FIG. 2 is a graphical depiction of the application of the above technique. Referring to FIG. 2, the states of each sub-circuit instance of INST0, . . . , INSTn are implicitly encoded as the input ports as described above. For example, assume there is a net 'N' in sub-circuit M, since M is instantiated n+1 times, there are n+1 instances of 'N', namely N0, N1, . . . , Nn. Using the above encoding, a single net 'N' is instantiated and its value is encoded as:

N=(N0 && F==0)||(N1 && F1==1)|| . . . ||(Nn && F==n)

Similarly, each output port from the single instance of subcircuit M is decoded back to multiple output ports, one for each of the n+1 instances of subcircuit M.

Once the encoding and decoding have been created, the input encoding, the output decoding and the single instance of subcircuit M may be simulated. Symbolic simulation for the instance of M is performed and the non-compressed values for the output ports are obtained by the decoding process.

Figure 3A:
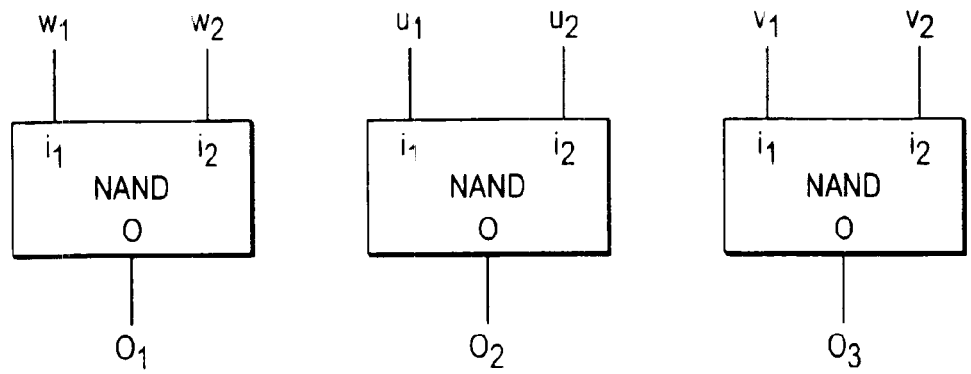
FIGS. 3A and 3B illustrate an exemplary circuit before and after encoding/decoding, respectively.

FIG. 3A illustrates an example circuit having three two input NAND gates prior to encoding. To encode these 3 instances requires 2 formal variables, referred to herein as f2, f1, where 2 is the ceiling of $\log_2 3$. Furthermore, let F[2:1]={f2, f1} be the bit vector.

Intuitively, the first instantiation of the NAND gate is encoded with F[2:1]=00, the second instantiation of the NAND gate is F[2:1]=01 and the third instantiation of the NAND gate is F[2:1]=10. The corresponding boolean encoding formulae are ~f2&&~f1, ~f2&&f1, f2&&~f1 respectively.

To execute/simulate the circuit in FIG. 3A, assume at some simulation snapshot that the value of signal s is val(s), the following are the values of the two encoded pins i1 and i2:

$$\text{val}(i1)=$$
$$(\sim f2\&\&\sim f1\&\&\text{val}(w1)\|\sim f2\&\&f1\&\&\text{val}(u1)\|f2\&\&\sim f1\&\&\text{val}(v1))$$

$$\text{val}(i2)=$$
$$(\sim f2\&\&\sim f1\&\&\text{val}(w2)\|\sim f2\&\&f1\&\&\text{val}(u2)\|f2\&\&\sim f1\&\&\text{val}(v2))$$

With above i1 and i2 being updated with the encoded values, the value of output o is $$\text{val}(o)=\sim(\text{val}(i1)\ \&\&\ \text{val}(i2))$$

With the substitution of the values, one could verify that $$\text{val}(o1)=\text{val}(o)|\{f2=0,\ f1=0\}=\sim(\text{val}(w1)\ \&\&\ \text{val}(w2))$$

$$\text{val}(o2)=\text{val}(o)|\{f2=0,\ f1=1\}=\sim(\text{val}(u1)\ \&\&\ \text{val}(u2))$$

$$\text{val}(o3)=\text{val}(o)|\{f2=1,\ f1=0\}=\sim(\text{val}(v1)\ \&\&\ \text{val}(v2))$$

Figure 3B:
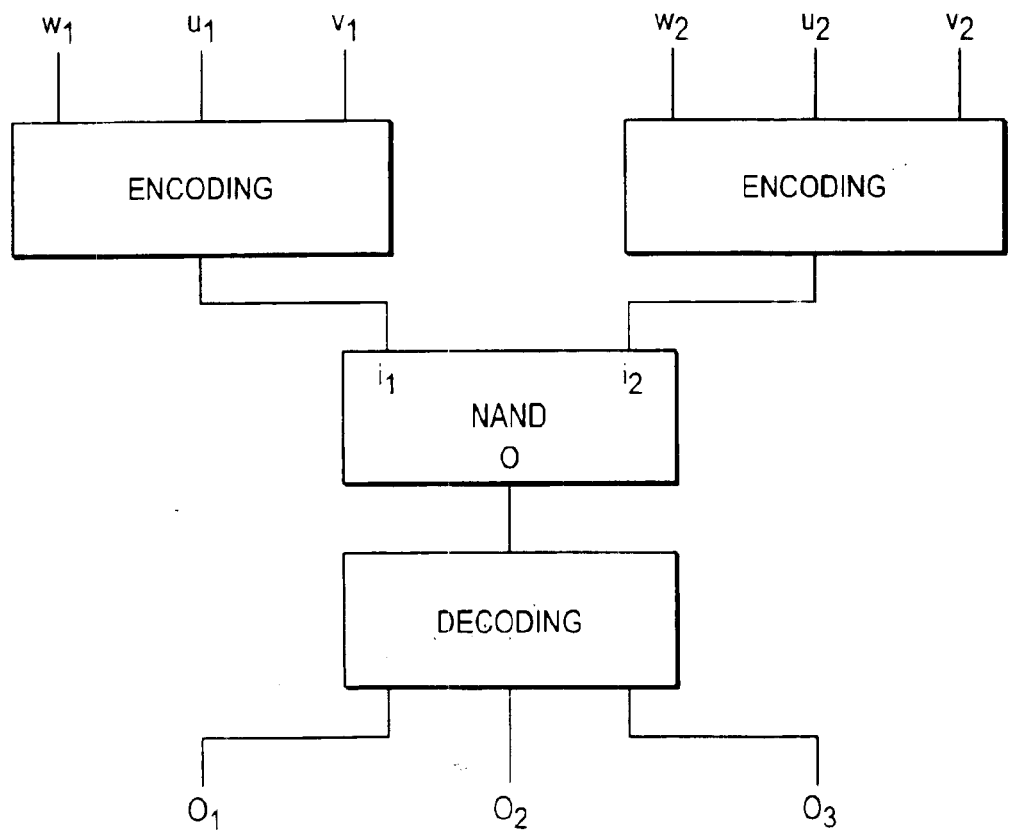

FIG. 3B illustrates the circuit of FIG. 3A after encoding and decoding.

The encoding process and decoding process may be implemented using techniques other than binary encoding/decoding. For example, one could use ternary encoding/decoding. The only constraint in the choice of an encoding process is that the final encoded values for the inputs should be consistent to the underlying symbolic simulation or formal manipulation. That is, the encoding process and the decoding process are consistent with each other. For example, if a symbolic simulation is performed using BDD (Binary Decision Diagram) for encoding the value states, then the PINi value should be converted to BDD also to enable the underlying engine to operate on them consistently. On the other hand, if the underlying simulation engine is using MTBDD (multi-terminal BDD), the encoding process converts the PINi value to MTBDD and the corresponding decoding process converts the computed value back to binary.

Hierarchically Symbolic Encoding/Decoding of Circuits

If a circuit has multiple hierarchies of subcircuits, the above compression can be invoked hierarchically. For example, a circuit with top level subcircuit 'top' which has k instances of subcircuit 'M' while subcircuit 'M' has n instances of subcircuit 'C' could be compressed into a circuit 'top' which has 1 instance of compressed subcircuit 'Mcompressed' which in turns has 1 instance of compressed subcircuit 'Ccompressed'. 'Mcompressed' and 'Ccompressed' at their respective hierarchies are encoded and decoded based on the above process. The total number of formal variables required in such a case would be is log2(m)+log2(n).

Symbolic Simulation of the Encoded/Compressed Circuit

The single instance of a submodule or subcircuit, with its input encoding and output decoding, may be simulated in a symbolic simulator, coupled with symbolic variables used to encode the values of the inputs of a circuit. For example, if the circuit is driven by 'm' symbolic bit variables S1, . . . , Sm while the circuit is also encoded by using 'l' formal variables F1, . . . , Fl, symbolic simulation may be performed on the single instance of the circuit using only 'm+l' symbolic variables 'S1, . . . , Sm, F1, . . . , Fl'.

Applications

The technique described above may be incorporated in a symbolic circuit simulator, in a switch level timing simulator, in a formal equivalence or model checking environment, and in a binary simulation for FPGA or even arbitrary circuit which could be synthesized and compressed into repetitive subcircuits.

Furthermore, the technique described herein could be even used in executing larger complicated software with many repetitive concurrent/parallel components such as processes. In such a situation, concurrent processes values could be again encoded/decoded based on their labeling and after such encoding, symbolically executing only one process to achieve the same effect of executing these many processes concurrently.

The present invention provides a number of advantages over the prior art. For example, the present invention allows for symbolically encoding to compress arbitrary repetitive sub-circuits, while the prior art techniques described above are restricted to a very regular, symmetric, or isomorphic circuit structures. The present invention also allows simulating very large size of circuit. In general, an exponential reduction could be achieved so that a circuit with n elements, along with all of its state, can be represented by data structures of size $\log_2(n)$.

Furthermore, the present invention achieves better runtime than techniques in the prior art by symbolically simulating the encoded circuit since states of circuit elements are compactly represented symbolically and operations could be performed symbolically.

Figure 4:
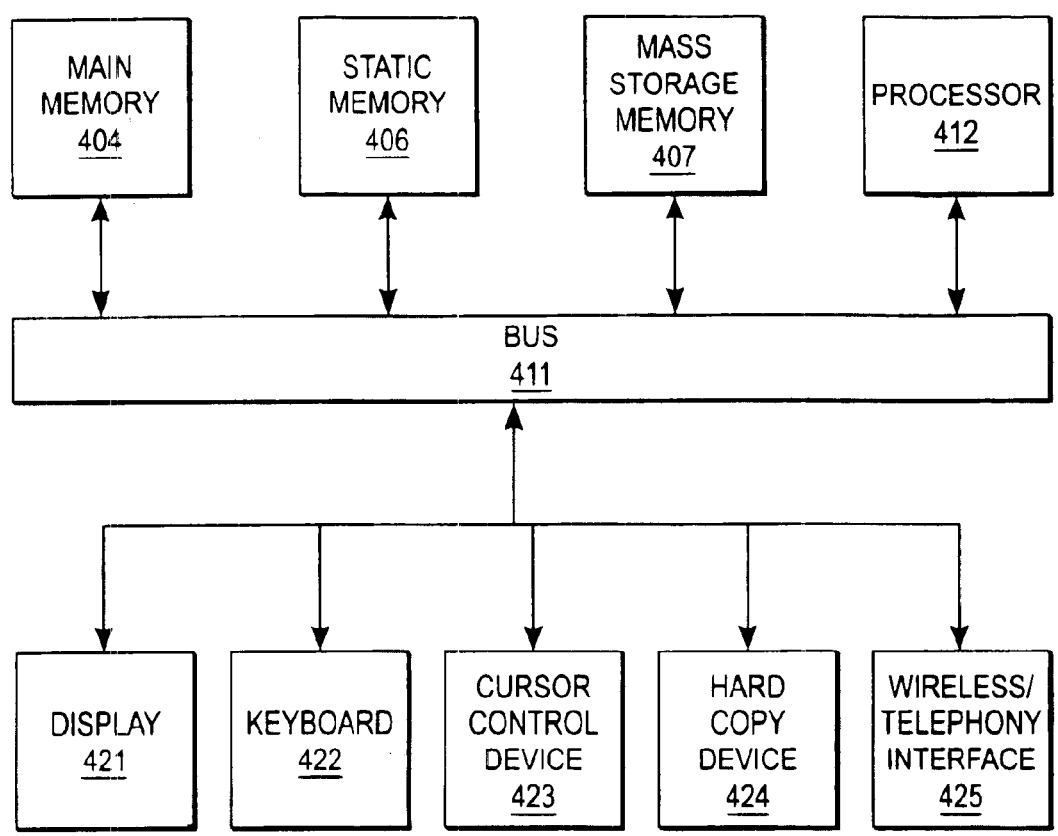
FIG. 4 is a block diagram of an exemplary computer system.

FIG. 4 is a block diagram of an exemplary computer system that may perform one or more of the operations described herein. Referring to FIG. 4, computer system 400 may comprise an exemplary client 450 or server 400 computer system. Computer system 400 comprises a communication mechanism or bus 411 for communicating information, and a processor 412 coupled with bus 411 for processing information. Processor 412 includes a microprocessor, but is not limited to a microprocessor, such as, for example, Pentium™, PowerPC™, Alpha™, etc.

System 400 further comprises a random access memory (RAM), or other dynamic storage device 404 (referred to as main memory) coupled to bus 411 for storing information and instructions to be executed by processor 412. Main memory 404 also may be used for storing temporary variables or other intermediate information during execution of instructions by processor 412.

Computer system 400 also comprises a read only memory (ROM) and/or other static storage device 406 coupled to bus 411 for storing static information and instructions for processor 412, and a data storage device 407, such as a magnetic disk or optical disk and its corresponding disk drive. Data storage device 407 is coupled to bus 411 for storing information and instructions.

Computer system 400 may further be coupled to a display device 421, such as a cathode ray tube (CRT) or liquid crystal display (LCD), coupled to bus 411 for displaying information to a computer user. An alphanumeric input device 422, including alphanumeric and other keys, may also be coupled to bus 411 for communicating information and command selections to processor 412. An additional user input device is cursor control 423, such as a mouse, trackball, trackpad, stylus, or cursor direction keys, coupled to bus 411 for communicating direction information and command selections to processor 412, and for controlling cursor movement on display 421.

Another device that may be coupled to bus 411 is hard copy device 424, which may be used for printing instructions, data, or other information on a medium such as paper, film, or similar types of media. Furthermore, a sound recording and playback device, such as a speaker and/or microphone may optionally be coupled to bus 411 for audio interfacing with computer system 400. Another device that may be coupled to bus 411 is a wired/wireless communication capability 425 to communication to a phone or handheld palm device.

Note that any or all of the components of system 400 and associated hardware may be used in the present invention. However, it can be appreciated that other configurations of the computer system may include some or all of the devices.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

I claim:

1. A method of simulating a circuit comprising:
   representing a plurality of identical components in a reduced form as a circuit having a single instance of the identical components with encoding for each input of the single instance to represent corresponding inputs to all of the plurality of identical components and decoding for each output port of the single instance to create output ports for the corresponding outputs associated with all of the plurality of identical components, wherein each output corresponds to the output of each identical component; and
   symbolically simulating the reduced form of the circuit with simulation results being the same as results of symbolically simulating the plurality of identical components.

2. The method defined in claim 1 wherein the circuit comprises n signals having n states, and further wherein encoding the circuit produces simulation run time data structures asymptotically smaller than n.

3. The method defined in claim 1 wherein the circuit comprises n signals having $2^n$ states, and further wherein encoding the circuit produces simulation run time data structures asymptotically close to $\log_2(n)$.

4. The method defined in claim 1 wherein each input port of the reduced form of the circuit is mapped to an encoded port and each output value is decoded back to a set of values of corresponding outputs of the plurality of identical components, where each value in the set of values corresponds to an output of one of the plurality of identical components.

5. The method defined in claim 4 wherein each input i of the single instance of the identical component in the reduced form represents the input i for each component in the plurality of identical components.

6. The method defined in claim 4 wherein each output i of the single instance of the identical component in the reduced form represents the output i for each component in the plurality of identical components.

7. The method defined in claim 1 wherein each component in the plurality of identical components comprises a plurality of identical subcircuits, and the single instance of the identical component in the reduced form includes a single instance of the identical subcircuit.

8. The method defined in claim 1 wherein input encoding in the reduced form is generated by applying binary encoding to inputs of the plurality of identical components.

9. The method defined in claim 1 wherein input encoding in the reduced form is generated by applying ternary encoding to inputs of the plurality of identical components.

10. The method defined in claim 1 wherein symbolically simulating the reduced form of the circuit is performed using Binary Decision Diagram (BDD).

11. The method defined in claim 1 wherein the components comprise one or more selected from the group consisting of a net, a port, an array, and a memory.

12. The method defined in claim 1 wherein at least one of the components comprises at least one signal having a plurality of states.

13. An apparatus of simulating a circuit comprising:
    means for representing a plurality of identical components in a reduced form as a circuit having a single instance of the identical components with encoding for each input of the single instance to represent corresponding inputs to all of the plurality of identical components and decoding for each output port of the single instance to create output ports for the corresponding outputs associated with all of the plurality of identical components, wherein each output corresponds to the output of each identical component; and
    means for symbolically simulating the reduced form of the circuit with simulation results being the same as results of symbolically simulating the plurality of identical components.

14. The apparatus defined in claim 13 wherein the circuit comprises n signals having $2^n$ states, and further wherein encoding the circuit produces simulation run time data structures asymptotically smaller than n.

15. The apparatus defined in claim 13 wherein the circuit comprises n signals having $2^n$ states, and further wherein encoding the circuit produces simulation run time data structures asymptotically close to $\log_2(n)$.

16. The apparatus defined in claim 13 wherein each input port of the reduced form of the circuit is mapped to an encoded port and each output value is decoded back to a set of values of outputs of the plurality of identical components, where each value in the set of values corresponds to an output of one of the plurality of identical components.

17. The apparatus defined in claim 16 wherein each input i of the single instance of the identical subcircuit in the reduced form of each input i represents the input i for all of the plurality of identical subcircuits.

18. The apparatus defined in claim 16 wherein each output i of the single instance of the identical component in the reduced form represents the output i for each component in the plurality of identical components.

19. The apparatus defined in claim 13 wherein each component in the plurality of identical components comprises a plurality of identical subcircuits, and the single instance of the identical component in the reduced form includes a single instance of the identical subcircuit.

20. The apparatus defined in claim 13 wherein input encoding in the reduced form is generated by applying binary encoding to inputs of the plurality of identical components.

21. The apparatus defined in claim 13 wherein input encoding in the reduced form is generated by applying ternary encoding to inputs of the plurality of identical components.

22. The apparatus defined in claim 13 wherein symbolically simulating the reduced form of the circuit is performed using Binary Decision Diagram (BDD).

23. The apparatus defined in claim 13 wherein the components comprise one or more selected from the group consisting of a net, a port, an array, and a memory.

24. The apparatus defined in claim 13 wherein at least one of the components comprises at least one signal having a plurality of states.

25. An article of manufacture having one or more recordable media to store executable instructions which, when executed by a processing device, cause the processing device to:

represent a plurality of identical components in a reduced form as a circuit having a single instance of the identical components with encoding for each input of the single instance to represent corresponding inputs to all of the plurality of identical components and decoding for each output port of the single instance to create output ports for the outputs associated with all of the plurality of identical components, wherein each output corresponds to the output of each identical component; and symbolically simulate the reduced form of the circuit with simulation results being the same as results of symbolically simulating the plurality of identical components.

\* \* \* \* \*